(12) United States Patent
Oohashi

(10) Patent No.: US 6,602,751 B2
(45) Date of Patent: Aug. 5, 2003

(54) METHOD FOR MANUFACTURING SEMICONDUCTOR DEVICES

(75) Inventor: Takuo Oohashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/837,736

(22) Filed: Apr. 17, 2001

(65) Prior Publication Data

US 2001/0039093 A1 Nov. 8, 2001

(30) Foreign Application Priority Data

Apr. 17, 2000 (JP) .......................................... 2000-115695

(51) Int. Cl.$^7$ .......................................... H01L 21/8234
(52) U.S. Cl. ...................... 438/275; 438/528; 438/981
(58) Field of Search ................................ 438/200, 258, 438/275, 407, 528, 766, 966, 981

(56) References Cited

U.S. PATENT DOCUMENTS

| 4,651,406 A | * | 3/1987 | Shimizu et al. | 438/275 |
| 5,576,226 A | * | 11/1996 | Hwang | 438/275 |
| 6,258,673 B1 | * | 7/2001 | Houlihan et al. | 438/981 |

FOREIGN PATENT DOCUMENTS

JP     6-53492     *   2/1994

* cited by examiner

Primary Examiner—Chandra Chaudhari
(74) Attorney, Agent, or Firm—Choate, Hall & Stewart

(57) ABSTRACT

A disclosed method for manufacturing semiconductor devices includes the steps of: implanting an ion in a region in which a medium thickness gate oxide film is to be formed, under such conditions that a range of fluorine may measure 15–150 nm in a P-type silicon substrate; removing a chemical oxide film on the surface or the region; and forming by oxidation processing the gate oxide film with the medium film thickness in the region.

12 Claims, 12 Drawing Sheets

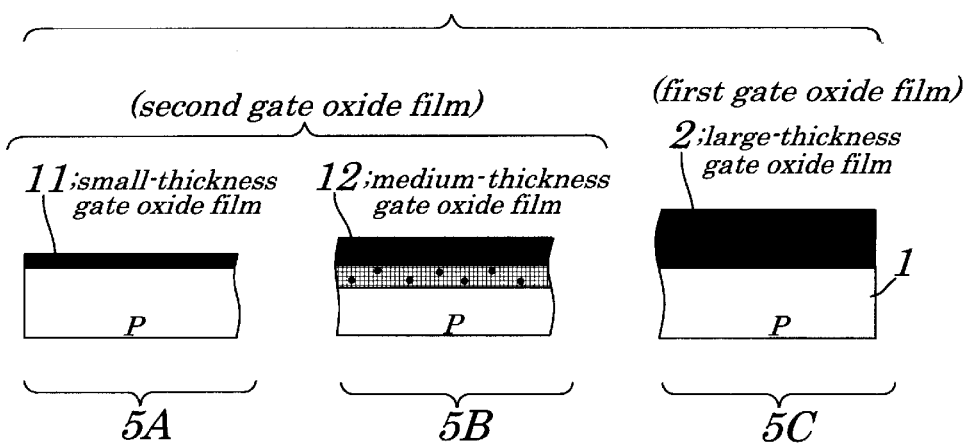
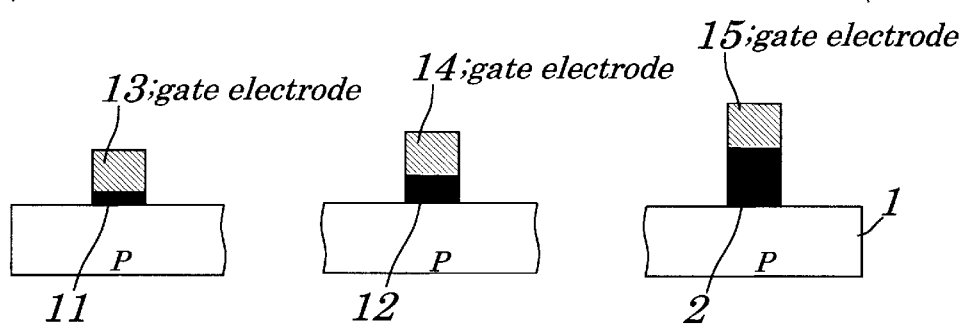
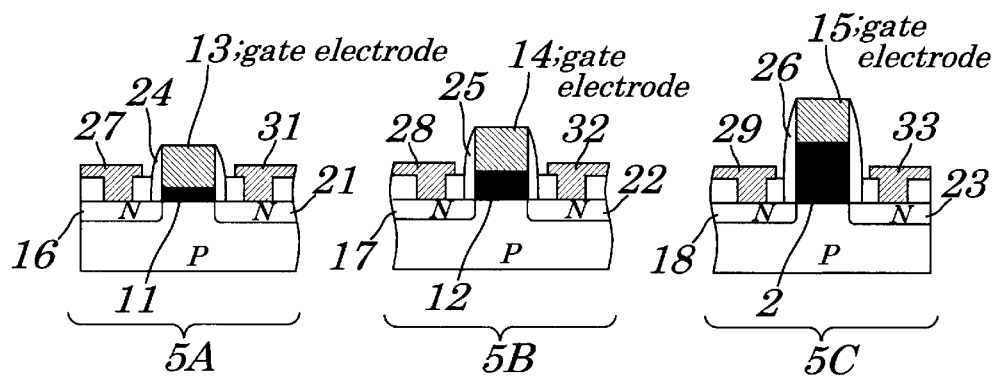

METHOD FOR MANUFACTURING SEMICONDUCTOR DEVICES

BACKGROUND OF THE INVENTION

1. Field of the Invention

The invention relates to a method for manufacturing semiconductor devices and, more particularly to, a method for manufacturing semiconductor devices in each of which three kinds of MOS (Metal oxide Semiconductor) transistors having a gate oxide film with different film thicknesses respectively are formed.

The present application claims priority of Japanese Patent Application No. 2000-115695 filed on Apr. 17, 2003, which is hereby incorporated by reference.

2. Description of the Related Art

Most LSIs (Large Scale Integrations), known as a representative of semiconductor devices, are made up of MOS transistors and are excellent for integration density. Such a MOSLSI can utilize its high integration density to reduce costs, thus finding wide applications in a variety of electronic equipment.

In a field of those LSIs, recently, such a type of LSI has been developed called a SOC (System On Chip) that incorporates on its one semiconductor chip a plurality of memories and logics to have desired functions. Since this type of LSI is typically incorporated and used in portable electronic equipment, it is designed to operate on a battery power source and also at the lowest possible source voltage for reducing power consumption.

The logics required in the above-mentioned type of LSI to provide desired functions are made up of a combination of MOS transistors having different properties, specifically of a plurality of kinds of MOS transistors having a gate oxide film with different film thicknesses respectively. The properties of the MOS transistors mainly depend or the film thickness of the gate oxide film in that a thinner the film thickness, a larger becomes an ON-state current, thus enabling high-speed operations. If the gate oxide film is thin, however, a gate leakage current increases, thus running counter to the purpose of power saving. Accordingly, to save power, it is necessary nor to form the gate oxide film too thick.

FIG. 8 schematically illustrates an example of an important portion, of a semiconductor device, that includes a logic circuit made up of three kinds of MOS transistors having different film thicknesses of the gate oxide film. As shown in FIG. 8, this semiconductor device 100 includes a core transistor (high-speed operational transistor) 101 made up of a first kind of MOS transistor M1 (FIG. 7) having a small film thickness for high speed operations of arithmetic/logical operations, image processing, or a like, a sub-core transistor (power saving transistor) 102 consisting of a second kind of MOS transistor M2 (FIG. 7) having a medium film thickness for arithmetic/logical operations, image processing, or a like which do not require such high speed operations as those of the core transistor 101, and a peripheral transistor (low-speed operational transistor) 103 consisting of a third kind of MOS transistor M3 (FIG. 7) having a large film thickness which needs not operate at a high speed for driving peripheral circuitry including I/O (input/output) circuits or a like.

Here, terms of small film thickness, medium film thickness, and large film thickness of the gate oxide film do not refer to absolute small, mediums and large values of the gate oxide film thickness respectively but refer to a relative comparison in film thickness of the three kinds of MOS transistors having different gate oxide film thicknesses.

FIG. 7 is schematic cross-sectional view of a specific construction of the semi conductor device 100 as shown in FIG. 8. As shown in FIG. 7, on a same semiconductor substrate 111 of the semiconductor device 100 are formed the first kind of MOS transistor M1 which makes up the core transistor 101 and has a small gate oxide films thickness of 1.5–2.0 nm, the second kind of MOS transistor M2 which makes up the sub-core transistor 102 and has a medium gate oxide film thickness of 2.2–2.5 nm, and the third kind of MOS transistor M3 which makes up the peripheral transistor 103 and has a large gate oxide film thickness of 3.5–7.5 nm.

The first through third kinds of MOS transistors M1 through M3 have source regions 66 through 68, drain regions 7 through 73, three different thicknesses of gate oxide films, a small-thickness gate oxide film 61, a medium-thickness gate oxide film 62, and a large-thickness gate oxide film 52, gate electrodes 63 through 65, and gate side walls 74 through 76 respectively. Each of the source regions 66 through 68 and each of the drain regions 71 through 73 may be either of a so-called "LDD (Lightly Doped Drain) construction" consisting essentially of a high impurity concentration region and a low impurity concentration region or a so-called "non-LDD construction" consisting essentially of only a high impurity concentration region.

Of these three kinds of MOS transistors M1 through M3, the second kind of MOS transistor M2 making up the sub-core transistor 102 is provided to meet the purpose of power saving with a not so high operation speed as that of the core transistor 101, in such a configuration that its gate oxide film is formed thicker than the first kind of MOS transistor M1 but thinner than the third kind of MOS transistor M3 making up the peripheral transistor 103.

Accordingly, by forming the second kind of MOS transistor M2 to provide the sub-core transistor 102, such an above-mentioned multifarious-functional LSI can be manufactured that can operate at a moderately high speed in arithmetic/logical operations, image processing, and a like with saved power dissipation.

The following will describe a prior art method for manufacturing a semiconductor device along its steps with respect to FIG. 6A through FIG. 6K.

First, as shown in FIG. 6A, for example, a P-type silicon substrate 51 is oxidized to form throughout thereon a first gate oxide film 52a to a thickness of 3–7 nm as an initial gate oxide film. As described later, the first gate oxide film 52a provides the large-thickness gate oxide film 52 of the third kind of MOS transistor M3 making up the peripheral transistor 103. Next, as shown in FIG. 6B, a photo-resist film 53 is applied on a whole surface of the first gate oxide film 52a and then patterned by photolithography to thereby expose only a region 55B, in which the medium-thickness gate oxide film 62 of the second kind of MOS transistor M2 making up the sub-core transistor 102 is to be formed.

Next, as shown in FIG. 6C, residual photo-resist film 53 is used as a mask to selectively implant a fluorine (F) ion through the first gate oxide film 52a into the P-type silicon substrate 51 only in the region 55B, thus forming an ion implantation layer 56.

As described later, this fluorine ion implantation is conducted in order to obtain accelerated oxidation effects when forming by oxidation of the medium-thickness gate oxide film 62 of the second kind of MOS transistor making up the sub-core transistor 102 (FIG. 8) To obtain a sufficient level of the accelerated oxidation effect by use of fluorine, specifically, fluorine ions are implanted under such preset ion implantation conditions that the fluorine may have a range Rp measuring about 10 nm or less in the P-type silicon substrate 51, in order to deposit much of the fluorine on the upper surface of the P-type silicon substrate 51 in the region 55B.

The present applicant applied earlier a method for using argon (Ar) as an ion implantation impurity to obtain the accelerated oxidation effect in forming the medium-thickness gate oxide film (Japanese Patent Application No. Hei 12-32047, filed Feb. 9, 2000, unpublished at present). Later, however, the present applicant found that use of argon as an impurity damages the P-type silicon substrate 51 when ions are implanted, thus increasing a gate leakage current, to guard against which the present applicant found that use of fluorine in place of argon can solve such a disadvantage. Accordingly, as mentioned above, use of fluorine as the ion implantation impurity is effective in obtaining the accelerated oxidation effect.

Next, as shown in FIG. 6D, the photo-resist film 53 (FIG. 6C) contaminated by ion implantation is removed and then a new photo-resist film 54 is applied and patterned to expose the above-mentioned region 55B and a region 55A, in which the small-thickness gate oxide film 61 of the first kind of MOS transistor M1 (FIG. 7) making up the core transistor 101 (FIG. 8) is to be formed. Next, as shown in FIG. 6E, a residual of the photo-resist film 54 is used as a mask to remove the first gate oxide film 52a in the regions 55A and 55B.

Next, as shown in FIG. 6F, the photo-resist film 54 is removed. Specifically, this photo-resist film 54 is removed in two steps of a plasma removal step and an acid removal step. First, by a first step of plasma removal, most of the photo-resist film 54 is removed. By this first step alone, however, the photoresist film 54 cannot completely be removed, so that by a second step of acid removal by use of a mixed solution of sulfuric acid ($H_2SO_4$) and hydrogen peroxide ($H_2O_2$), the residual of photo-resist film 54 is completely removed. During this acid removal step, a chemical oxide film 57 is formed on the upper surface of the P-type silicon substrate 51 to a film thickness of 0.8–1.0 nm.

This film thickness of the chemical oxide film 57 is not negligible as compared to the above-mentioned small-thickness gate oxide film, 61, so that if that chemical oxide film 57 is left as it is, that small-thickness gate oxide film 61 may not be controlled easily. To guard against this, the chemical oxide film 57 needs to be removed.

Next, as shown in FIG. 6G, the P-type silicon substrate 51 is cleaned by washing it using a mixed solution of sulfuric acid and hydrogen peroxide. On the surface of the P-type silicon substrate 51, however, the chemical oxide film 57 is formed again. Therefore, as shown in FIG. 6H, the chemical oxide film 57 is washed and removed with a diluted hydrofluoric acid.

Next, as shown in FIG. 6I, oxidation processing is conducted to simultaneously form the small-thickness gate oxide film 61 with a thickness of 1.5–2.0 nm in the region 55A on the P-type silicon substrate 51 and the medium-thickness gate oxide film 62 with a thickness of 2.0–2.5 nm in the region 55B on the P-type silicon substrate 51. Second gate oxide films provide the small-thickness gate oxide film 61 and the medium-thickness gate oxide film 62, as the above-mentioned first gate oxide film 52a provides the large-thickness gate oxide film 52. During this oxidation processing, on the upper surface of the region 55B into which fluorine ions have been implanted beforehand, the medium-thickness gate oxide film 62 thicker than the small-thickness gate oxide film 61 formed on the region 55A is grown by the accelerated oxidation effect. At the same time, by this oxidation processing, the first gate oxide film 52a, which is the initial gate oxide film, is increased in film thickness to some extent, thus forming the large-thickness gate oxide film 52 with a thickness of 3.5–7.5 nm on the upper surface of a region 55C, in which the third kind of MOS transistor making up the peripheral transistor 103 (FIG. 8) is to be formed.

Next, as shown in FIG. 6J, throughout on the small-thickness gate oxide film 61, the medium-thickness gate oxide film 62, and the large-thickness gate oxide film 52 is formed a poly-crystal silicon film by CVD (Chemical Vapor Deposition) or a like, all of which are then patterned to form the gate electrodes 63 through 65 in the regions 55A through 55A respectively. Next, as shown in FIG. 6K, ions of an N-type impurity are implanted in a self-alignment manner by use of those gate electrodes 63 through 65 to form respective source regions 66 through 68 and the respective drain regions 71 through 73 and then to form, by a known method, side wall films 74 through 76, source electrodes (wiring lines) 77 through 79, and drain electrodes (wiring lines) 81 through 83 are formed to thus complete the semiconductor device 100 such as shown in FIG. 7.

The prior art semiconductor device manufacturing method, however, suffers from a problem of reduction in the accelerated oxidation effect due to fluorine ion implantation.

That is, as described with FIG. 6C, to obtain a sufficient level of the accelerated oxidation effect, conventionally fluorine ions have been implanted under such conditions that the range Rp may be about 10 nm or less in the P-type silicon substrate 51 in order to deposit much of the fluorine in the region 55B on the upper surface of the P-type silicon substrate 51. If, however, fluorine ions are implanted in such a manner that its range Rp may be set at such a comparatively shallow position in the P-type silicon substrate 51, the ion implantation layer 56 is formed near the surface of the P-type silicon substrate 51, so that the fluorine, which will be diffused rapidly in, the silicon substrate and readily evaporated, would be evaporated readily from the ion implantation layer 56 off the substrate 51 by the effect of a high temperature during the subsequent oxidation processing. This in turn reduces concentration of fluorine in the region 55B, in which the medium-thickness gate oxide film, gate oxide film 62, is to be formed.

Also, the prior art semiconductor device manufacturing method suffers from a problem in that when the gate oxide films, the small-thickness gate oxide film 61, the medium-thickness gate oxide film 62, and the large-thickness gate oxide film. 52 are formed by oxidation processing after fluorine ions are implanted, in particular, the medium-thickness gate oxide film 62 is deteriorated, thus increasing its gate leakage current.

That is, when typically ions of a desired impurity are implanted into the P-type silicon substrate 51, defects due to this ion implantation occur inevitably inside the P-type silicon substrate 51, especially around the range Rp as a center numerously. This holds true also with the case of implantation of a fluorine ion. Such defects generated inside the P-type silicon substrate 51 by the fluorine ion implantation are readily caused to the medium-thickness gate oxide film 62 by the effect of a high temperature during the subsequent oxidation processing, thus deteriorating the medium-thickness gate oxide film 62. This in turn further increases the gate leakage current of the semiconductor device 100.

Further, as described with FIG. 6H, the first gate oxide film 52a formed already in the region 55C, providing the large-thickness gate oxide film 52, is etched and deteriorated when the chemical oxide film 57 is washed and removed with DHF. This would farther increase the gate leakage current of the relevant semiconductor device.

SUMMARY OF THE INVENTION

In view of the above, it is an object of the invention to provide a method for manufacturing a semiconductor device wherein when three kinds of MOS transistors having a gate oxide film with a small film thickness, a medium film thickness, and a large film thickness respectively are formed on the same semiconductor substrate, gate oxide films can be prevented from being deteriorated while maintaining a high level of an accelerated oxidation effect of a medium-thickness gate oxide film, thus reducing a gate leakage current.

According to a first aspect of the present invention, there is provided a semiconductor device manufacturing method for forming three kinds of MOS transistors having a gate oxide film with a small film thickness, a medium film thickness, and a large film thickness respectively on a semiconductor substrate, including:
- an initial gate oxide film forming step for forming an initial gate oxide film with the large film thickness throughout on the semiconductor substrate;
- an initial gate oxide film removing step for selectively removing a region of the initial gate oxide film on the semiconductor substrate in which region the gate oxide film with the small film thickness and the gate oxide film with the medium film thickness are to be formed;
- a fluorine ion implanting step for selectively implanting ions of fluorine only in a region on the semiconductor substrate in which region the gate oxide film with the medium film thickness is to be formed; and
- an oxidation processing step for simultaneously forming in a region on the semiconductor substrate in which region the gate oxide film with the small film thickness is to be formed and in a region on the semiconductor substrate in which region the gate oxide film with the medium film thickness is to be formed a gate oxide film with a small film thickness and a gate oxide film with a medium film thickness which are both smaller than a film thickness of the initial gate oxide film, respectively.

According to a second aspect of the present, there is provided a semiconductor device manufacturing method for forming three kinds of MOS transistors having a gate oxide film with a small film thickness, a medium film thickness, and a large film thickness respectively on a semiconductor substrate, including:
- a first gate oxide film forming step for forming a first gate oxide film having the large film thickness throughout on the semiconductor substrate;
- a first gate oxide film removing step for selectively removing a region of the first gate oxide film on the semiconductor substrate in which region the gate oxide film with the small film thickness and the gate oxide film with the medium film thickness are to be formed;
- a fluorine ion implanting step for selectively implanting ions of fluorine only in a region on the semiconductor substrate in which region the gate oxide film with the medium film thickness is to be formed; and
- a second gale oxide film forming step for forming in a region on the semiconductor substrate in which region the gate oxide film with the small film thickness is to be formed and in a region on the semiconductor substrate in which region the gate oxide film with the medium film thickness is to bee formed a second gate oxide film including a gate oxide film with a small film thickness and a gate oxide film with a medium film thickness which are both smaller than a film thickness of the first gate oxide film, respectively.

According to a third aspect of the present invention, there is provided a semiconductor device manufacturing method for forming three kinds of MOS transistors having a gate oxide film with a small film thickness, a medium film thickness, and a large film thickness respectively on a semiconductor substrate, including:
- a first gate oxide film forming step for forming a first gate oxide film having the large film thickness throughout on the semiconductor substrate;
- a first gate oxide film removing step for selectively removing a region of the first gate oxide film on the semiconductor substrate in which region the gate oxide film with the small film thickness and the gate oxide film with the medium film thickness are to be formed;
- a chemical oxide film forming step for forming a chemical oxide film in a region on the semiconductor substrate in which region the gate oxide film with the small film, thickness and the gate oxide film with the medium film thickness are to be formed;
- a fluorine ion implanting step for selectively implanting ions of fluorine through the chemical oxide film only in a region on the semiconductor substrate in which region the gate oxide film with the medium film thickness is to be formed; and
- a second gate oxide film forming step for, after the chemical oxide film is removed, forming in a region or the semiconductor substrate in which region the gate oxide film with the small film thickness is to be formed and in a region on the semiconductor substrate in which region the gate oxide film with the medium film thickness is to be formed a second gate oxide film including a gate oxide film with a small film thickness and a gate oxide film with a medium film thickness which are both smaller than a film thickness or the first gate oxide film, respectively.

In the foregoing third aspect, a preferable mode is one wherein in the fluorine ion implanting step, fluorine ions are implanted under such preset conditions that a range Rp of the fluorine may measure 15–150 nm in the semiconductor substrate.

Also, according to a fourth aspect of the present invention, there is provided a semiconductor device manufacturing method for forming three kinds of MOS transistors having a gate oxide film with a small film thickness, a medium film thickness, and a large film thickness respectively on a semiconductor substrate, including:
- a first gate oxide film forming step for forming a first gate oxide film having the large film thickness throughout on the semiconductor substrate;
- a first gate oxide film removing step for selectively removing a region of the first gate oxide film on the semiconductor substrate in which region the gate oxide film with the small film thickness and the gate oxide film with the medium thickness are to be formed;
- a chemical oxide film forming step for forming a chemical oxide film in a region on the semiconductor substrate in which region the gate oxide film with the small film thickness and the gate oxide film with the medium film thickness are to be formed;

a fluorine ion implanting step for selectively implanting ions of fluorine through the chemical oxide film only in a region on the semiconductor substrate in which region the gate oxide film with the medium film thickness is to be formed; and a second gate oxide film forming step for, with the chemical oxide film left unremoved, forming in a region on the semiconductor substrate in which region the gate oxide film with the small film thickness is to be formed and in a region on the semiconductor substrate in which region the gate oxide film with the medium film thickness is to be formed a second gate oxide film including a gate oxide film with a small film thickness and a gate oxide film with a medium film thickness which are both smaller than a film thickness of the first gate oxide film, respectively.

In the foregoing fourth aspect, a preferable mode is one wherein in the fluorine ion implanting step, fluorine ions are implanted under such preset conditions that a range Rp of the fluorine may measure about 20 nm in the semiconductor substrate. Also, a preferable mode is one wherein the fluorine ion implanting step is replaced by an alternative fluorine ion implanting step for implanting a fluorine ion not through the chemical oxide film but directly into the semiconductor substrate.

With the above configurations, fluorine ions are implanted in a region, in which the medium-thickness gate oxide film is to be formed, under such ion implantation conditions that the range of fluorine Rp may measure 15–150 nm in the substrate, to subsequently remove the chemical oxide film on the surface of that region and then form by oxidation processing the medium-thickness gate oxide film in that region, thus enabling, during the oxidation processing, suppressing fluorine evaporation and also preventing defects from being caused to the medium-thickness gate oxide film when fluorine ions are implanted.

Also, fluorine ions are implanted in a region in which the medium-thickness gate oxide film is to be formed under such ion implantation conditions that the range of fluorine Rp may measure about 20 nm in the substrate, to subsequently oxidize that region as covered with the chemical oxide film in order to form the medium-thickness gate oxide film in that region, thus enabling, during the oxidation processing, suppressing fluorine evaporation and also preventing defects from being caused to the medium-thickness gate oxide film when fluorine ions are implanted.

Thus, when forming the three kinds of MOS transistors having small-thickness, medium-thickness, and large-thickness gate oxide films on the same semiconductor substrate, it is possible to prevent the gate oxide films from being deteriorated, thus capable of reducing gate leakage current, while maintaining the accelerated oxidation effect of the medium-thickness gate oxide film at an enhanced level.

BRIEF DESCRIPTION OF THE DRAWINGS

The above and other objects, advantages, and features of the invention will be more apparent from the following description taken in conjunction with the accompanying drawings, in which:

FIGS. 1A to 1K are process drawings for showing stepwise a method for manufacturing a semiconductor device according to a first embodiment of the present invention;

DESCRIPTION OF THE PREFERRED EMBODIMENTS

The following will describe embodiments of the invention with reference to the drawings. The description is specifically made using examples.

First Embodiment

A method for manufacturing a semiconductor device according to the first embodiment is described along the steps with reference to FIGS. 1A to 1K.

Figure 1A:
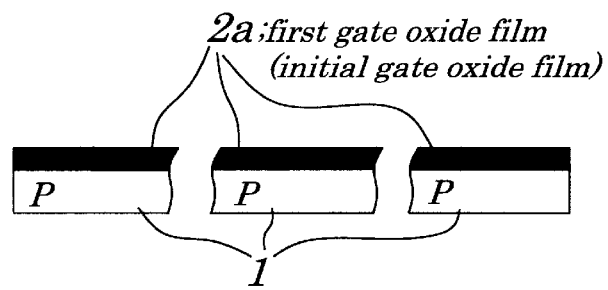
Figure 2:
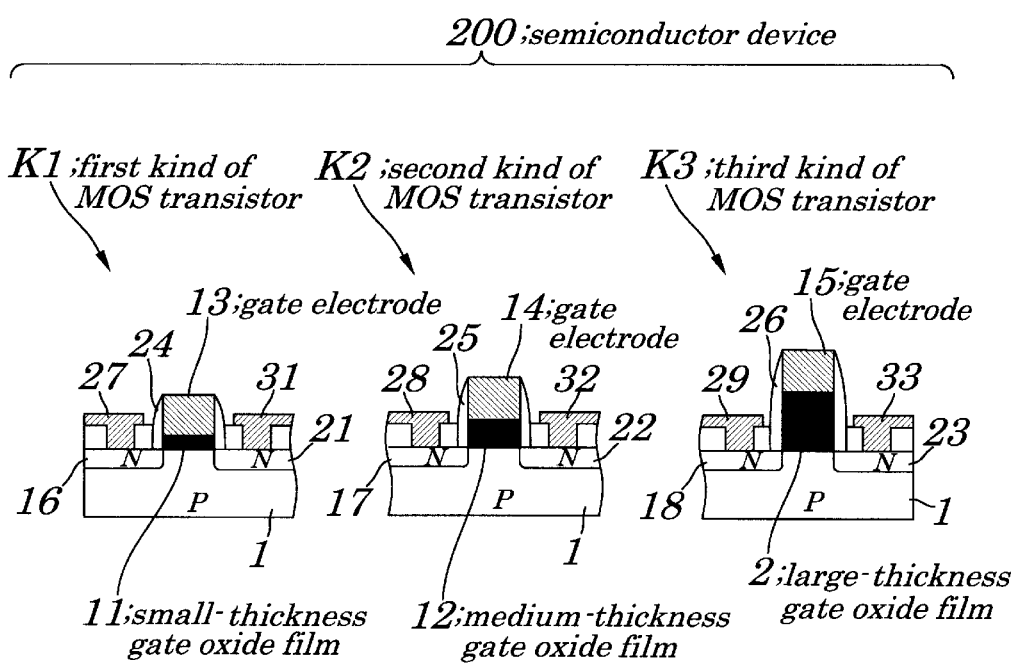
FIG. 2 illustrates cross-sectional views for schematically showing three kinds of MOS transistors with different thicknesses of a gate oxide film which makes up a semiconductor device according to the first embodiment of the present invention.

First, as shown in FIG. 1A, for example, a P-type silicon substrate 1 is oxidized by a typical oxidation method to form throughout on a upper surface of the P-type silicon substrate 1 a first gate oxide film 2a to a thickness of 3–7 nm as an initial gate oxide film. As described later, the first gate oxide film 2a provides a large-thickness gate oxide film 2 of a third kind of MOS transistor K3 making up a peripheral transistor, as shown in FIG. 2.

Figure 1B:
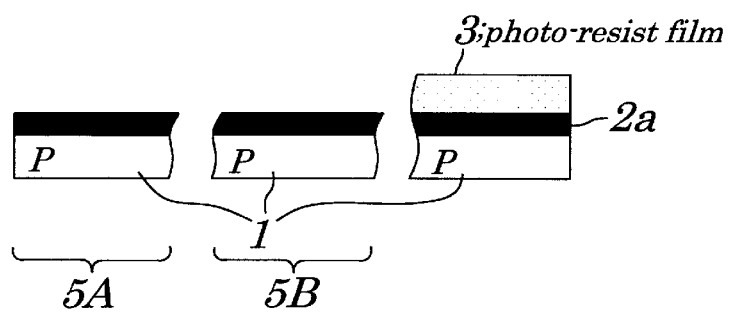

Next, as shown in FIG. 1B, a photo-resist film 3 is applied throughout on the upper surface of the first gate oxide film 2a and then patterned by photolithography to thereby expose a region 5A, in which a small-thickness gate oxide film of a first kind of MOS transistor K1 (FIG. 2) making up a core transistor is to be formed and a region 5B, in which a medium-thickness gate oxide film of the second kind of MOS transistor (FIG. 2) making up a sub-core transistor is to be formed.

Figure 1C:
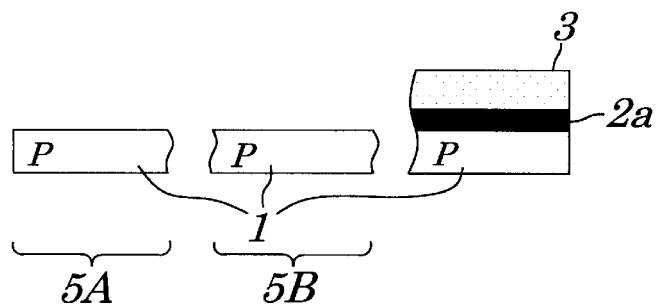
Figure 1D:
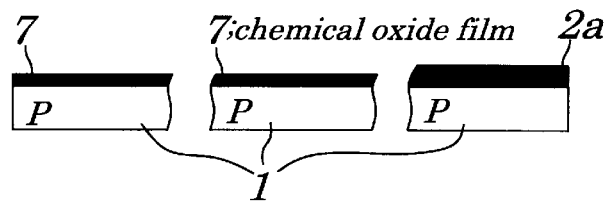

Next, as shown in FIG. 1C, a residual of photo-resist film 3 is used as a mask to remove the first gate oxide film 2a in the regions 5A and 5B by wet etching by use of an acid-based solution or dry etching. Next, as shown in FIG. 1D, the photo-resist film 3 is removed. The photo-resist film 3 is removed specifically in two steps of a plasma removal step and an acid removal step. First, by a first step of plasma removal, most of the photo-resist film 3 is removed. This first step alone, however, is not enough to completely remove the photo-resist film 3, so that by a second step of acid removal by use of a fixed solution of sulfuric acid and hydrogen peroxide, the residual of photo-resist film 3 is removed completely. This acid removal step causes a chemical oxide film 7 to be formed to a thickness of 0.8–1.0 nm on the upper surface of the P-type silicon substrate 1.

As mentioned above, film thickness of the chemical oxide film 7 is not negligible as compared to that of the small-thickness gate oxide film, so that if that chemical oxide film 7 is left as it is, it may be difficult to control the small-thickness gate oxide film in some cases. To guard against this, the chemical oxide film 7 needs to be removed before the small-thickness gate oxide film is formed.

Figure 1E:
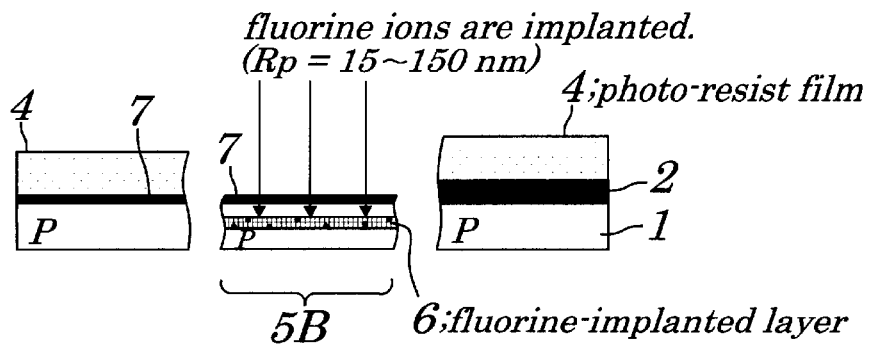

Next, as shown in FIG. 1E, after the photo-resist film 3 contaminated by the plasma and acid removal steps is removed, a new photo-resist film 4 is applied and patterned to thereby expose only the region 5B, in which a medium-thickness gate oxide film of the second kind of MOS transistor (FIG. 2) making up a sub-core transistor is to be formed. Next, a residual of photo-resist film 4 is used as a mask to selectively implant a fluorine ion through the chemical oxide film 7 into only the region 5B on the P-type silicon substrate 1, thus forming a fluorine-implanted layer 6. In this case fluorine ions are implanted under such preset conditions that the fluorine range Rp may measure 15–150 nm in the P-type silicon substrate 1. That is, in this example, fluorine ions are implanted. In such a manner that its range Rp is set at a comparatively shallow position inside the P-type silicon substrate 1.

Figure 1F:
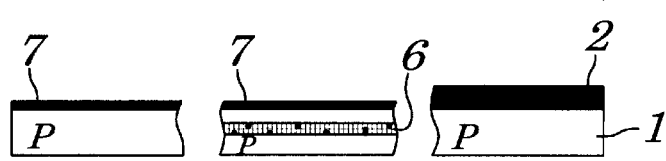

Next, as shown in FIG. 1F, the photo-resist film 4 is removed. Like in the case of FIG. 1D, the photo-resist film 4 is removed specifically in two steps of a plasma removal step and an acid removal step. First, by the first step of plasma removal, most of the photo-resist film 4 is removed. Next, by the second step of acid removal by use of a mixed solution of sulfuric acid and hydrogen peroxide, a residual of the photo-resist film 4 is removed completely. During this acid removal step, a chemical oxide film 7 is formed again on the upper surface of the P-type substrate 1.

Figure 1G:
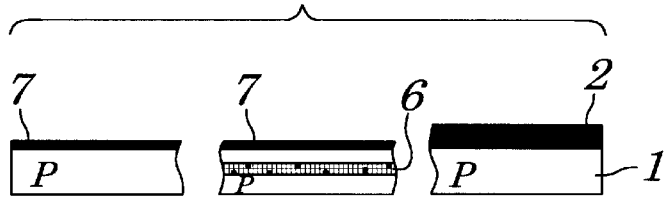

Next, as shown in FIG. 1G, the P-type silicon substrate 1 is cleaned by washing it with a mixed solution of sulfuric acid and hydrogen peroxide. On the upper surface of the P-type silicon substrate 1, however, a chemical oxide film 7 is formed again.

Figure 1H:
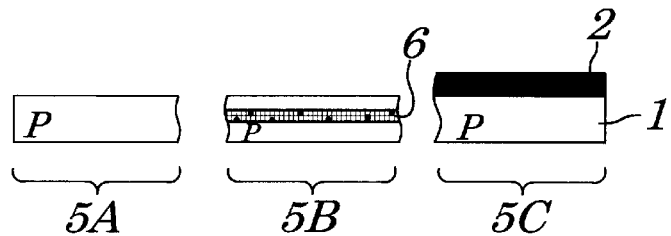

Therefore, as shown in FIG. 1H, the P-type silicon substrate 1 is washed with DHF (diluted hydrofluoric acid) to remove the chemical oxide film 7.

Next, as shown in FIG. 1I, the P-type silicon substrate 1 is oxidized in an oxygen-containing atmosphere to simultaneously form a small thickness gate oxide film 11 with a thickness of 1.5–2.0 nm in the region 5A and a medium thickness gate oxide film 12 with a thickness of 2.0–2.5 nm in the region 5B. Second gate oxide films provide the small-thickness gate oxide film 11 and the medium-thickness gate oxide film 12, as the above-mentioned first gate oxide film 52a provides the large-thickness gate oxide film 2. During this oxidation processing, on the upper surface of the region 5B into which fluorine ions are implanted beforehand, the medium thickness gate oxide film 12 is permitted by accelerated oxidation effect to grow thicker than the small thickness gate oxide film 11 formed on the upper surface of the region 5A. At the same time, during this oxidation processing, also the first gate oxide film 2a, which is the initial gate oxide film, is increased in film thickness to some extent to form the large-thickness gate oxide film 2 with a thickness of 3.5–7.5 nm on the upper surface of a region 50, in which the third kind of MOS transistor K3 (FIG. 2) making up the peripheral transistor is to be formed.

Next, as shown in FIG. 1J, a polysilicon film is formed by CVD or a like throughout on the surfaces of the gate oxide films, the small thickness gaze oxide film 11, medium, thickness gate oxide film 12, and large-thickness gate oxide film 2 and then all of those films are patterned into desired shapes to thereby form gate electrodes 13 through 15 in the regions 5A through 5C respectively. Next, as shown in FIG. 1K, ions of an N-type impurity are implanted in a self-alignment manner by use of the gate electrodes 13 through 15 to form source regions 16 through 18 and drain regions 21 through 23 and then to form, by a known method, side wall films 24 through 26, source electrodes (wiring lines) 27 through 29, and drain electrodes (wiring lines) 31 through 33, thus completing the semiconductor device 200 as shown in FIG. 2.

As mentioned above, by this example of semiconductor device manufacturing method, to obtain the accelerated oxidation effect fluorine ions are implanted under such preset ion implantation conditions that its range Rp may measure 15–150 nm in the P-type silicon substrate 1, thus forming the fluorine-implanted layer 6 (FIG. 2) so that the range Rp may be set at a comparatively shallow position inside the P-type silicon substrate 1. Accordingly, even when fluorine is evaporated by a high temperature due to the subsequent oxidation processing, it is possible to suppress fluorine from moving toward the surface of the P-type silicon substrate 1, that is endure longer, so that the accelerated oxidation effect can endure longer and be maintained at an enhanced level.

Also, since, as mentioned above, the fluorine-implanted layer is formed at a comparatively shallow position in the P-type silicon substrate 1, even when oxidation processing is conducted after fluorine ions are implanted, there is no danger that defects formed in the P-type silicon substrate 1 are caused to the medium-thickness gate oxide film 12. Accordingly, this medium-thickness gate oxide film 12 can be prevented from being deteriorated, thus reducing its gate leakage current.

Also, by this example of the semiconductor device manufacturing method, as shown in FIG. 1H, the region 5A, in which the small thickness gate oxide film 11 with the smallest thickness (1.5–2.0 nm) is to be formed, is formed, as shown in FIG. 1I, by oxidation processing after the chemical oxide film 7 with a thickness of 0.8–1.0 nm is completely removed from its surface, so that it can be thus formed free of an effect of the chemical oxide film 7. Therefore, the small-thickness gate oxide film 11, can be controlled with a high accuracy.

Figure 3:
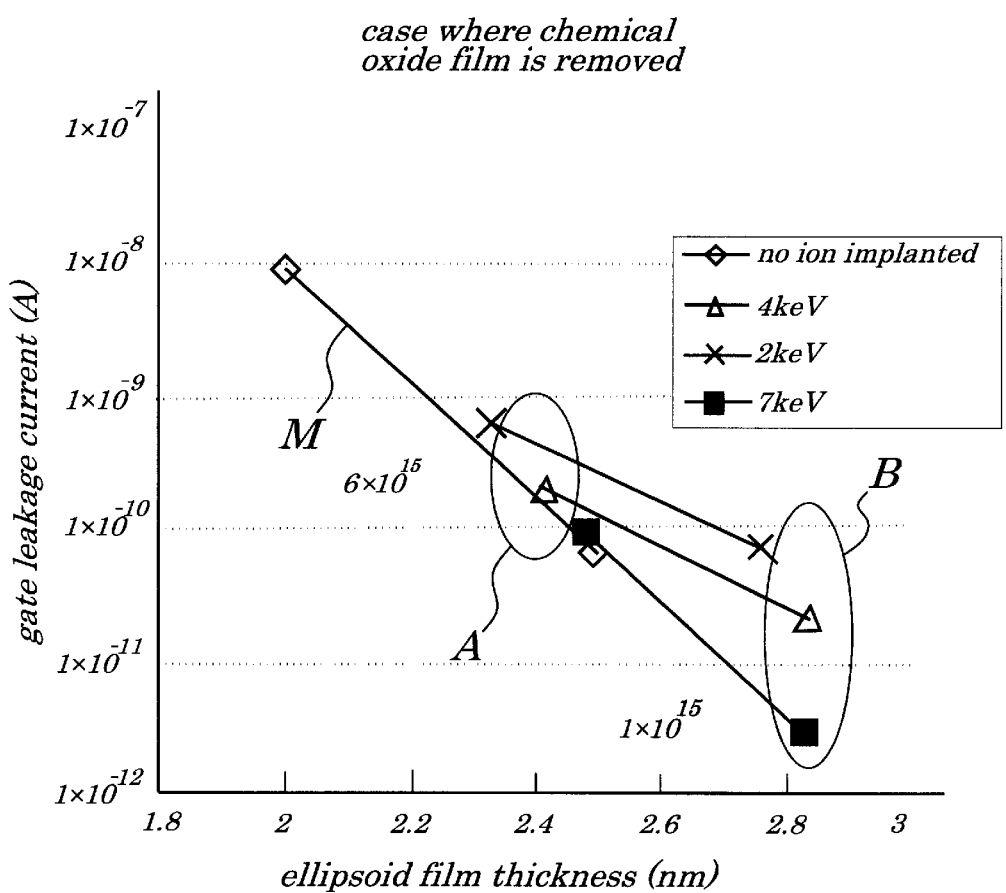
FIG. 3 is graph for showing a gate leakage current characteristic obtained with the first embodiment of the present invention.

FIG. 3 is a graph for indicating the gate leakage current characteristic of the semiconductor device obtained by this embodiment, specifically a relationship between a gate leakage current (vertical axis) and an ellipsoid film thickness (horizontal axis). In the graph, a ◇ mark represents a characteristic in the case where no fluorine ion was implanted, a △ mark represents a characteristic in a case where fluorine ions were implanted at an acceleration energy of 4 keV, an X mark represents a characteristic in a case where fluorine ions were implanted at an acceleration energy of 2 keV, and a ■ mark represents a characteristic in a case where fluorine ions were implanted at an acceleration energy of 7 keV. Also, a group A indicates a characteristic where fluorine ions were implanted as a dosage of $6 \times 10^{14}/cm^2$ and a group B, at a dosage of $1 \times 10^{15}/cm^2$. In this graph, it can be considered that a closer to a reference line M drawn downward from the ◇ mark representing the non-fluorine-ion-implanted case, a better will be the gate leakage current characteristic.

As apparent from FIG. 3, the three characteristics represented by the X, △, and ■ marks in the group A are all close to the reference line M, thus indicating excellent gate leakage current characteristic. In particular, the ■-mark characteristic, positioned on the reference line M, is most excellent, which is followed by the Δ-mark and the X-mark characteristics in this order. This phenomenon indicates that even with a same dosage in ion implantation of fluorine, a higher a setting of acceleration energy, the better will be the gate leakage current characteristic. With the increasing acceleration energy, however, the P-type silicon substrate 1 is damaged more seriously, so that the acceleration energy must be limited to some extent. An experiment has shown that when a range Rp measures about 10 nm, the gate leakage current increases, and when it measures about 15 nm, the gate leakage current can be suppressed. Also, it the range Rp exceeds 150 nm, the gate leakage current increases. Those results indicate that the range Rp should preferably be set in a range of 15–150 nm.

The two characteristics represented by the X and Δ marks in the group B are far away from the reference line M, thus indicating a deteriorated gate leakage current characteristic. The ■-mark characteristic in the group B, however, is positioned on the reference line M, thus indicating a better gate leakage current characteristic.

Thus, by this embodiment, fluorine ions are implanted in the region 5B, in which the medium-thickness gate oxide film 12, is to be formed, under such ion implantation conditions that the range of fluorine Rp may measure 15–150 nm in the P-type silicon substrate 1 and then the chemical oxide film 7 on the upper surface of the region 5B is removed to subsequently for by oxidation processing the medium-thickness gate oxide film 12, in the region B, so that it is possible to suppress fluorine from being evaporated during the oxidation processing and also prevent defects from being caused to the medium-thickness gate oxide film 12, during the fluorine ion implantation therein.

Thus, when three kinds of MOS transistors having a gate oxide film of small, medium, and large thicknesses respectively are formed on the same semiconductor device, it is possible to prevent the gate oxide films from being deteriorated in order to reduce the gate leakage current while keeping the accelerated oxidation effect of the medium-thickness gate oxide film at an enhanced level.

Second Embodiment

The configuration or a method for manufacturing a semiconductor device according to this embodiment differs largely from that of the above-mentioned first embodiment in that after fluorine ions are implanted, a medium-thickness gate oxide film is formed without removing a chemical oxide film. The following will describe the method for manufacturing a semiconductor device according to this embodiment along its steps with reference to FIGS. 4A to 4H.

Figure 4A:
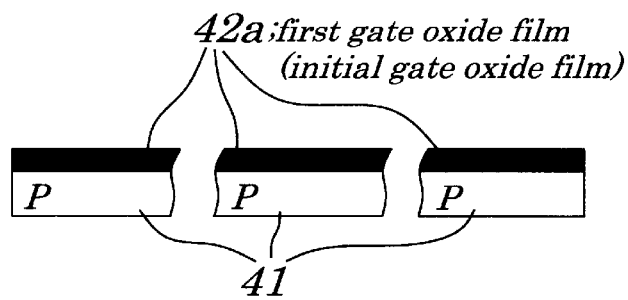
FIGS. 4A to 4H are process drawings for showing stepwise a method for manufacturing a semiconductor device according to a second embodiment of the present invention.

First, as shown an FIG. 4A, for example, a P-type silicon substrate 41 is oxidized by usual thermal oxidation to form a first gate oxide film 42a as an initial gate oxide film to a thickness of 3–7 nm throughout on the surface thereof. As described later, the first gate oxide film 42a provides a large-thickness gate oxide film 42 (FIG. 4H) of a third kind of MOS transistor making up the peripheral transistor.

Figure 4B:
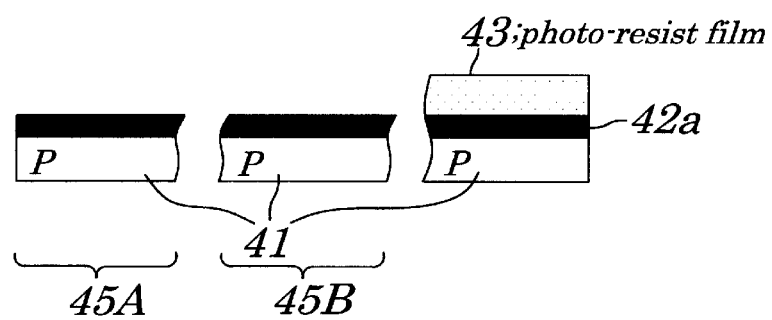

Next, as shown in FIG. 4B, a photo-resist film 43 is applied throughout on the upper surface of the first gate oxide film 42a and then patterned by photolithography to expose a region 45A, in which a small-thickness gate oxide film 48 (FIG. 4H) of the first kind of MOS transistor making up the core transistor is to be formed, and a region 45B, in which a medium-thickness gate oxide film 49 (FIG. 4H) of the second kind of MOS transistor making up the sub-core transistor is to be formed.

Figure 4C:
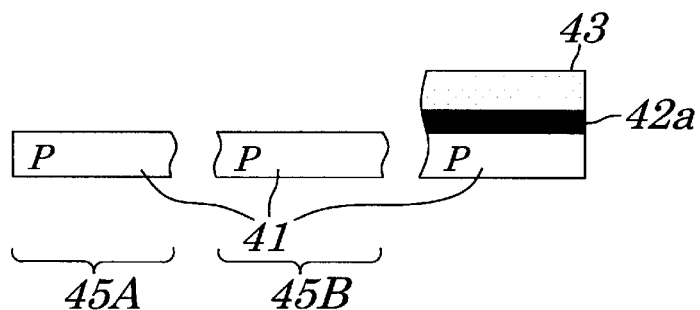

Next, as shown in FIG. 4C, a residual of the photo-resist film 43 is used as a mask to remove the first gate oxide film 42a in the regions 45A and 45B by wet etching by use of an acid-based solution or dry etching.

Figure 4D:
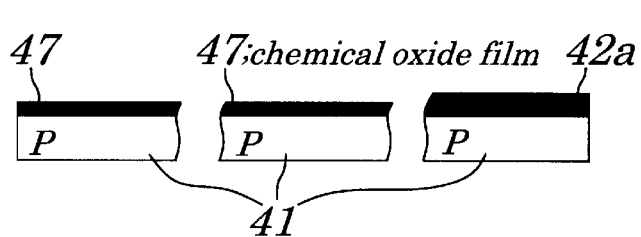

Next, as shown in FIG. 4D, the photo-resist film 43 is removed. This photo-resist film 43 is removed specifically in two steps of a plasma removal step and an acid removal step. First, by a first step of plasma removal, most of the photo-resist film 43 is removed. By this first step alone, however, tie photoresist film 43 cannot completely be removed, so that residual of photo-resist film 43 is removed completely by a second step of acid removal by use of a mixed solution of sulfuric acid and hydrogen peroxide. During this acid removal step, a chemical oxide film 47 is formed to a thickness of 0.8–1.0 nm on the upper surface of the P-type silicon substrate 41.

Figure 4E:
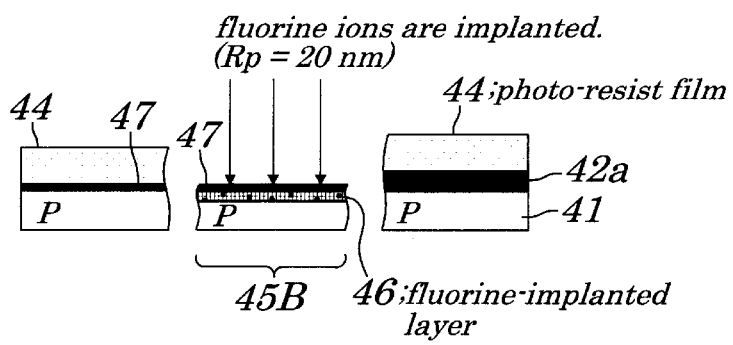

Next, as shown in FIG. 4E, after the photo-resist mask 43 (FIG. 4C) contaminated by the plasma removal and acid removal processes, a new photo-resist film 44 is applied and patterned to expose only the region 45B, in which the medium-thickness gate oxide film 49 (FIG. 4H) of the second kind of MOS transistor making up the sub-core transistor is to be formed. Next, a residual of photo-resist film 44 is used as a mask to selectively implant a fluorine ion into the P-type silicon substrate 41 only in the region 45B, thus forming a fluorine-implanted layer 46. Fluorine ions are implanted under such preset ion implantation conditions that a range Rp of fluorine may measure about 20 nm or less in the P-type silicon substrate 1. That is, in this example, fluorine ions are implanted so that the range Rp may be set at a shallow position in the P-type silicon substrate 41.

Figure 4F:
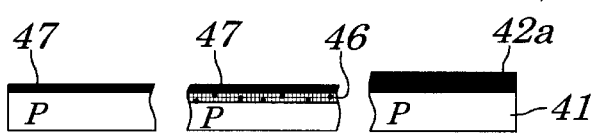

Next, as shown in FIG. 4F, the photo-resist film 44 is removed. Like in the case of FIG. 4D, this photo-resist film 44 is removed specifically in two steps of a plasma removal step and an acid removal step. First, by a first step of plasma removal, most of the photo-resist film 44 is removed. Next, a residual of photo-resist film 44 is removed completely by a second step of acid removal by use of a mixed solution of sulfuric acid and hydrogen peroxide. During this acid removal step, the chemical oxide film 47 is formed again on the upper surface of the P-type silicon substrate 41.

Figure 4G:
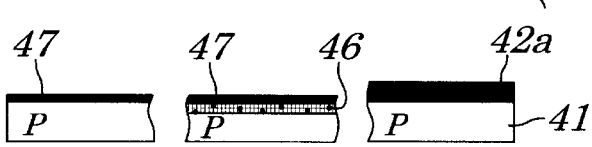

Next, as shown in FIG. 4G, the P-type silicon substrate 41 is cleaned by washing it using a mixed solution of sulfuric acid and hydrogen peroxide. On the upper surface of the P-type silicon substrate 41, however, the chemical oxide film 47 is formed again. In this embodiment, however, unlike in the case of the first embodiment, this chemical oxide film 47 is left unremoved.

Figure 4H:
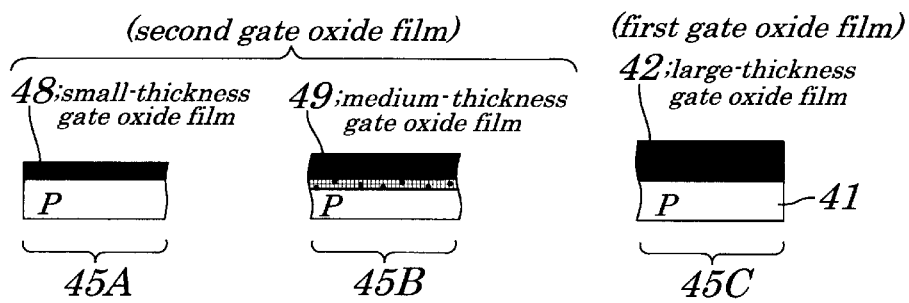

Next, as shown in FIG. 4H, the P-type silicon substrate 41 is oxidized at about 1000° C. in an oxygen-containing atmosphere to simultaneously form the small-thickness gate oxide film 48 with a thickness of 1.5–2.0 nm in the region 45A thereon and the medium thickness gate oxide film 49 with a thickness of 2.0–2.5 nm in the region 45B thereon. Second gate oxide films provide the small-thickness gate oxide film 48 and the medium-thickness gate oxide film 49, as the above-mentioned first gate oxide film 42a provides the large-thickness gate oxide film 42. During this oxidation processing, on the upper surface of the region 45B into which fluorine ions are implanted beforehand, by the accelerated oxidation effect, the medium, thickness gate oxide film 49 is permitted to grow thicker than the small-thickness gate oxide film 48 formed on the upper surface of the region. 45A. At the same time, also this oxidation processing causes the first gate oxide film 42a, which is the initial gate oxide film, to be increased in film thickness to some extent, thus forming the large-thickness gaze oxide film 42 with a thickness of 3.5–7.5 nm on the surface of a region 45C, in which the third kind of MOS transistor making up the peripheral transistor is to be formed.

Subsequently, roughly the same steps as those as shown in FIGS. 1J and 1K are conducted to thereby complete a semiconductor device.

Thus, according to the semiconductor device manufacturing method of this embodiment, to obtain the accelerated oxidation effect, fluorine ions are implanted under such ion implantation conditions that the range of fluorine Rp may measure about 20 nm in the P-type silicon substrate 41, to form the fluorine-implanted layer 46 such that the range Rp may be set on the upper surface of the P-type silicon substrate 41, following which the P-type silicon substrate 41 is oxidized as covered by the chemical oxide film 47 to thereby form the medium-thickness gate oxide film 49.

Accordingly, even at a high temperature during oxidation processing, it is possible to suppress fluorine from being evaporated, that is endure Longer than in the conventional cases, because the P-type silicon substrate 41 is covered with the chemical oxide film 47. Accordingly, the accelerated oxidation effect can endure longer and so be maintained at an enhanced level.

Also, since the P-type silicon substrate 41 is oxidized as covered with the chemical oxide film 47, there is no danger that defects formed in the P-type silicon substrate 41 are caused to the medium-thickness gate oxide film 49, by presence of the chemical oxide film 47. Also, defects can be repaired inside the P-type silicon substrate 41 because annealing is conducted at a high temperature during the oxidation processing. Accordingly, the medium-thickness gate oxide film 49, can be prevented from being deteriorated, thus reducing gale leakage current.

Also, by this semiconductor device manufacturing method according to this embodiment, fluorine ions are implanted under the presence of the chemical oxide film 47, thus eliminating a process of washing off this chemical oxide film 47 by use of DHF. Therefore, unlike in the conventional cases, a gate oxide film 52a formed beforehand in a region 55C to provide a large-thickness gate oxide film, gate oxide film 52, cannot be prevented from being deteriorated when it is etched.

Also, as shown in FIG. 4H, even when the region 45A, in which the small-thickness gate oxide film 48 of the smallest-thickness (1.5–2.0 nm), is to be formed, is oxidized as completely covered thereon with the chemical oxide film 47, the small-thickness gate oxide film 48, if comparatively large in film thickness (for example, 2.0 nm), can be formed with maintained controllability without being affected by the chemical oxide film 47.

Figure 5:
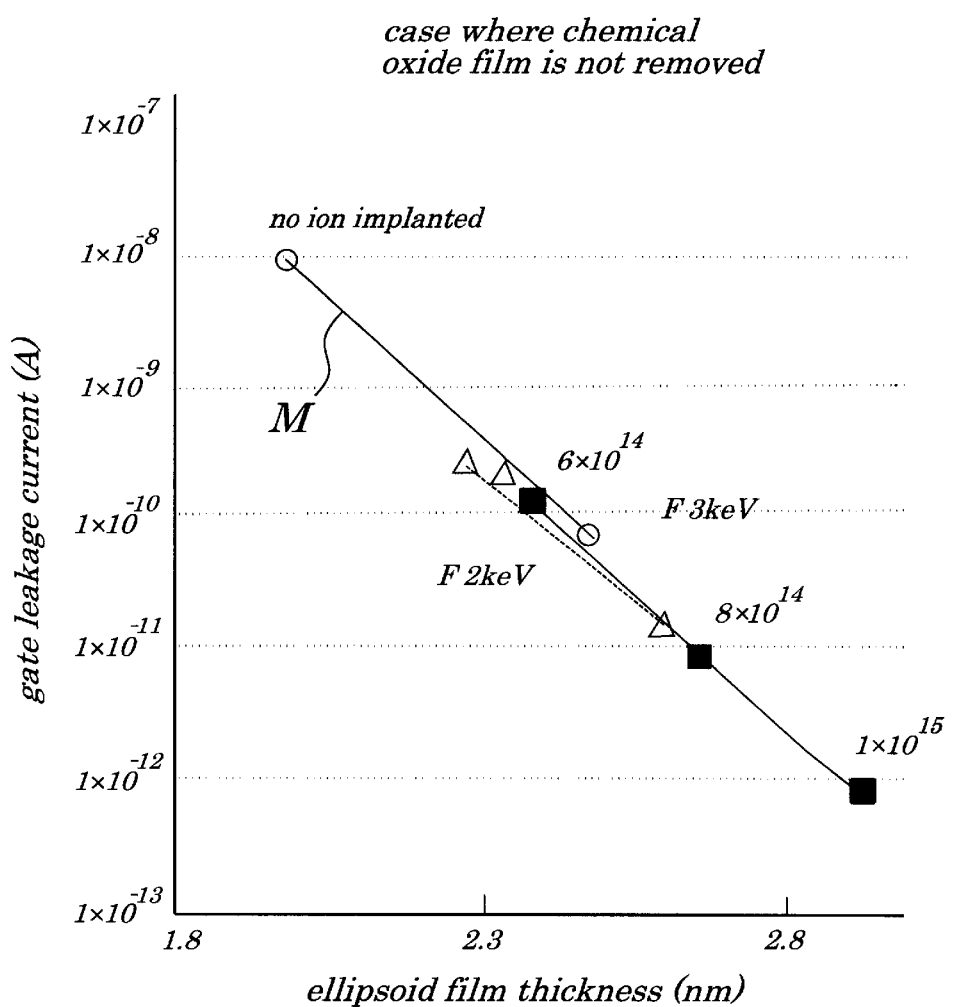
FIG. 5 is a graph for showing a gate leakage current characteristic obtained with the second embodiment of the present invention.
Figure 6A:
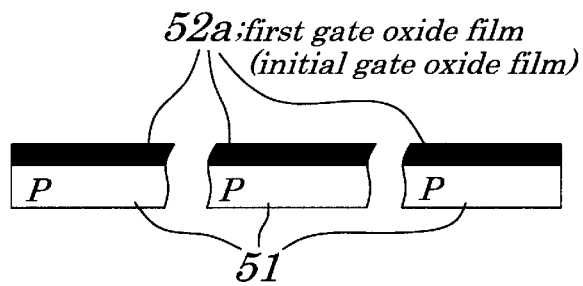
FIGS. 6A to 6K are process drawings for showing stepwise a conventional method for manufacturing a semiconductor device.
Figure 6B:
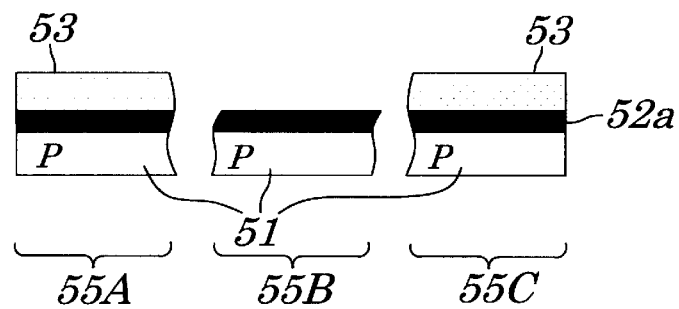
Figure 6C:
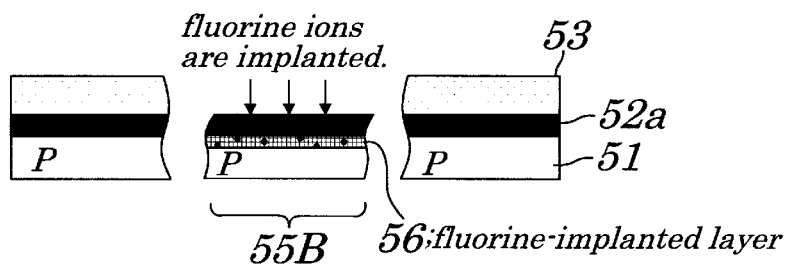
Figure 6D:
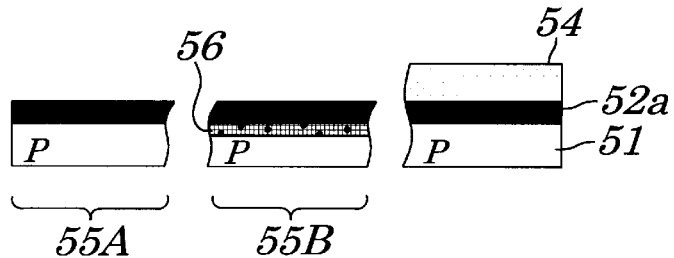
Figure 6E:
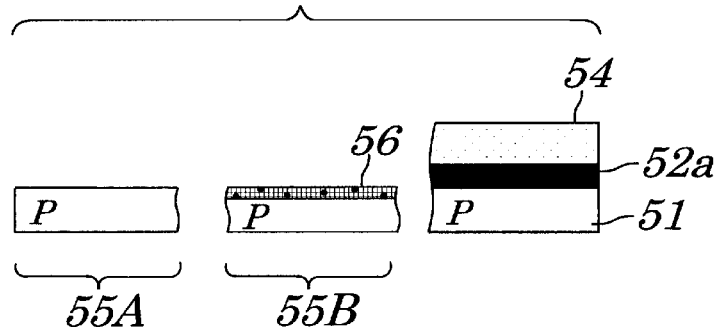
Figure 6F:
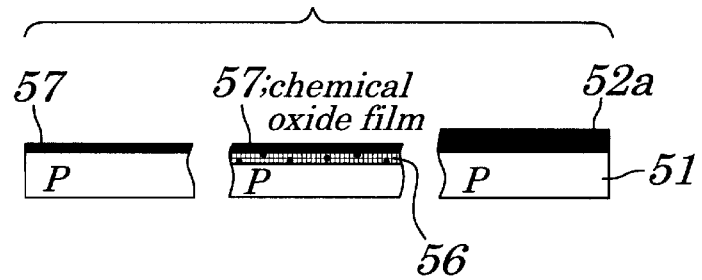
Figure 6G:
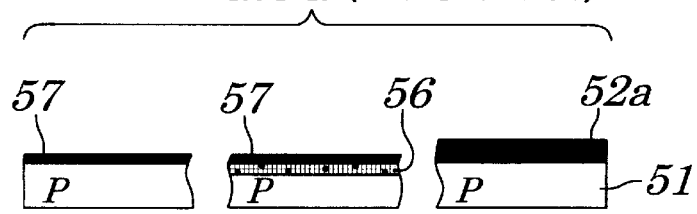
Figure 6H:
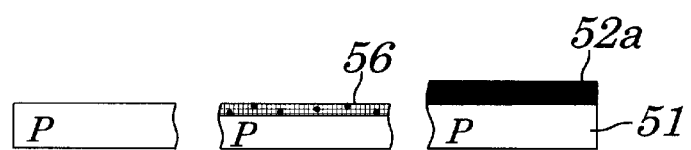
Figure 6I:
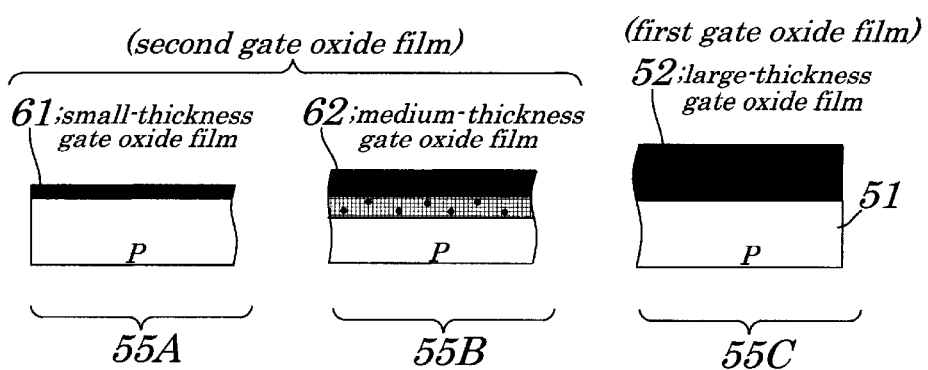
Figure 6J:
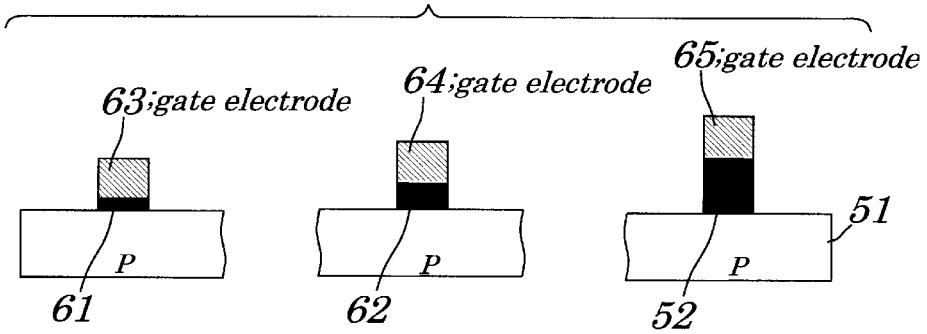
Figure 6K:
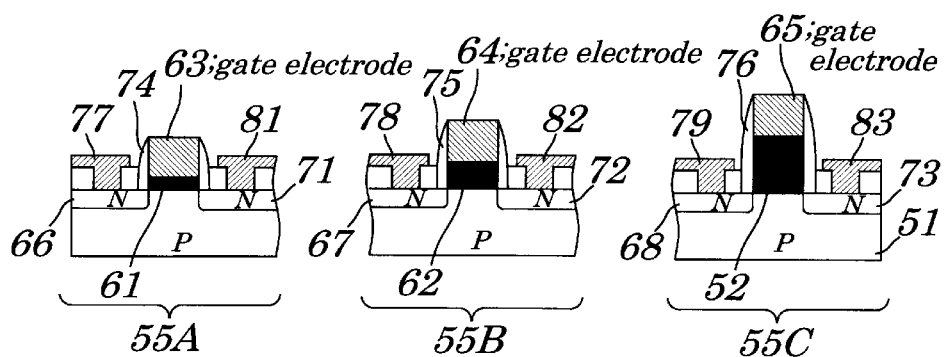
Figure 7:
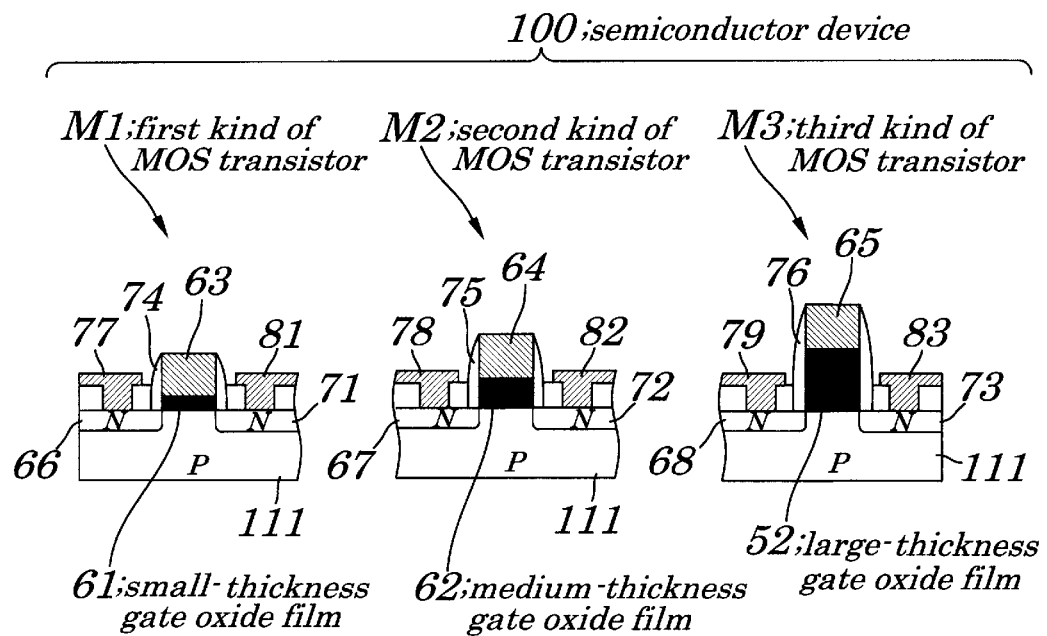
FIG. 7 illustrates cross-sectional vies for schematically showing three kinds of MOS transistors with different thicknesses of a gate oxide film which makes up a conventional semiconductor device in combination.
Figure 8:
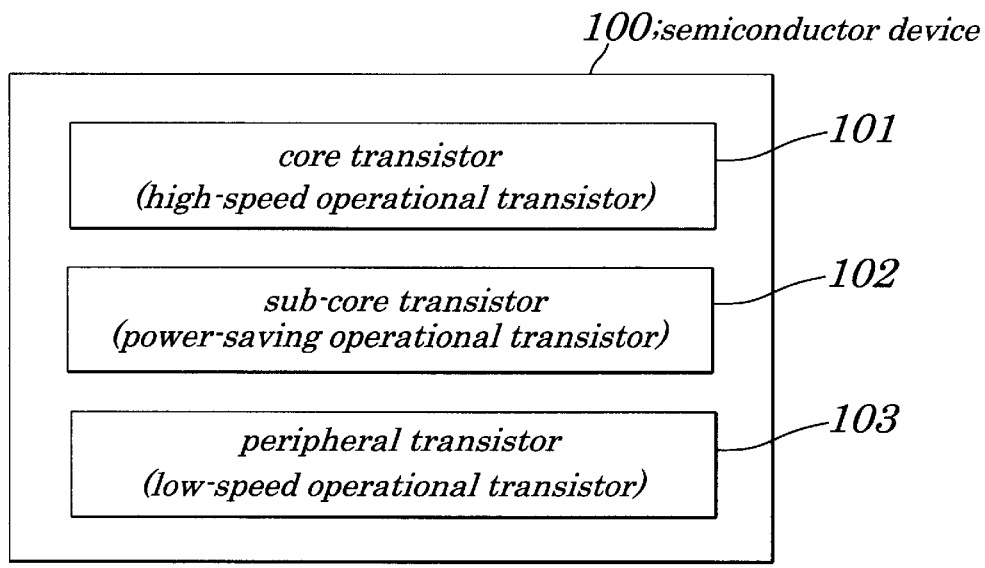
FIG. 8 is an illustration for schematically explaining a prior art related to the present invention.

FIG. 5 is a graph for indicating a gate leakage current characteristic of the semiconductor device obtained by this embodiment, specifically a relationship between a gate leakage current (vertical axis) and an ellipsoid film thickness (horizontal axis). In the figure, a Δ, and ■ marks represent the same as those in FIG. 3.

As apparent from FIG. 5, every characteristic is positioned on a reference line M or close thereto, thus indicating an excellent gate leakage current characteristic.

Thus, by the configuration of this embodiment, fluorine ions are implanted into the region 45B, in which the medium-thickness gate oxide film 49, is to be formed, under such ion implantation conditions that the range of fluorine Rp may measure about 20 nm in the P-type silicon substrate 41, to subsequently oxidize the region 45B as covered thereon with the chemical oxide film 47 in order to form the medium-thickness gate oxide film 49, therein, so that it is possible, during the oxidation processing, to suppress fluorine evaporation and also prevent defects from being caused to the medium-thickness gate oxide film 49, when fluorine tons are implanted.

Thus, almost the same effects as those by the above first embodiment can be obtained with configuration of this embodiment.

It is apparent that the present invention is not limited to the above embodiments but may be changed and modified without departing from the scope and spirit of the present invention.

For example, agate oxide nitride film may be formed in place of the gate oxide film. In this case, after fluorine ions are implanted into it, the substrate may be exposed to heat treatment in an oxygen-containing atmosphere and a nitrogen-containing atmosphere sequentially or simultaneously.

Also, although the above-mentioned embodiment has implanted fluorine ions through the chemical oxide film, it may be implanted not through the chemical oxide film but directly into the substrate. By thus implanting a fluorine ion not through the oxide film but directly, it is possible to prevent the occurrence of a so-called "knock-on phenomenon", in which oxygen atoms present in the oxide film is forced into the inside of the substrate when ions are implanted, thus avoiding the occurrence of defects liable to occur in the substrate by the knock-on-phenomenon. Also, although only one example has been described above about values of the small-thickness, medium-thickness, and large-thickness gate oxide films, the conductivity type of each semiconductor region of the MOS transistors, the conditions for fluorine ion implantation, the oxidation processing, and a like, may be changed as needed.

What is claimed is:

1. A semiconductor device manufacturing method for forming three kinds of metal oxide semiconductor transistors having a first gate oxide film with a small film thickness, a second gate oxide film with a medium film thickness, and a third gate oxide film with a large film thickness respectively on a semiconductor substrate, said method comprising:

an initial gate oxide film forming step for forming an initial gate oxide film with a large film thickness on said semiconductor substrate;

an initial gate oxide film removing step, using a first photo-resist, for selectively removing said initial gate oxide film in a first region wherein said first gate oxide film is to be formed on said semiconductor substrate and in a second region wherein said second gate oxide film is to be formed on said semiconductor substrate;

removing said first photo-resist using a process causing formation of a chemical oxide film in said first and second regions;

applying a second photo-resist exposing only said second region wherein said second photoresist is applied over said chemical oxide layer in said first region and over said initial gate oxide film in said third region;

a fluorine ion implanting step for selectively implanting ions of fluorine in said second region on said semiconductor substrate in accordance with said second photo-resist through said chemical oxide layer wherein said fluorine ions are implanted in a fluorine implanted layer at a comparatively shallow portion of said semiconductor substrate in said second region; and an oxidation processing step for simultaneously forming said first gate oxide film and said second gate oxide film in said first region and said second region on said semiconductor substrate, respectively.

2. A semiconductor device manufacturing method for forming three kinds of metal oxide semiconductor transistors having a first gate oxide film with a small film thickness, a second gate oxide film with a medium film thickness, and a third gate oxide film with a large film thickness respectively on a semiconductor substrate, said method comprising:

a first gate oxide film forming step for forming a third gate oxide film having a large film thickness on said semiconductor substrate;

a first gate oxide film removing step for selectively removing, using a photo-resist film, said third gate oxide film in a first region wherein said first gate oxide film is to be formed on said semiconductor substrate and in a second region wherein said second gate oxide film is to be formed on said semiconductor substrate;

removing said photo-resist film causing formation of a chemical oxide film;

a fluorine ion implanting step for selectively implanting ions of fluorine through said chemical oxide film in said second region on said semiconductor substrate wherein said fluorine ions are implanted in a fluorine implanted layer at a comparatively shallow portion of said semiconductor substrate in said second region; and a second gate oxide film forming step for forming a second gate oxide film made up of said first gate oxide film with said small film thickness and said second gate oxide film with said medium film thickness, which are both smaller than a film thickness of said third gate oxide film, in said first region and said second region on said semiconductor substrate, respectively.

3. A semiconductor device manufacturing method for forming three kinds of metal oxide semiconductor transistors having a first gate oxide film with a large film thickness, a second gate oxide film with a medium film thickness, and a third gate oxide film with a small film thickness respectively on a semiconductor substrate, said method comprising:

a first gate oxide film forming step for forming a first gate oxide film having said large film thickness throughout on said semiconductor substrate;

a first gate oxide film removing step for selectively removing, using a photo-resist film, said first gate oxide film in a first region wherein said third gate oxide film is to be formed on said semiconductor substrate and in a second region wherein said second gate oxide film is to be formed on said semiconductor substrate;

a chemical oxide film forming step for forming a chemical oxide film in said first region and said second region on said semiconductor substrate as a result of removing said photo-resist film;

a fluorine ion implanting step for selectively implanting ions of fluorine through said chemical oxide film in said second region on said semiconductor substrate wherein said fluorine ions are implanted in a fluorine implanted layer at a comparatively shallow portion of said semiconductor substrate in said second region;

a chemical oxide film removing step; and a second gate oxide film forming step for forming a second gate oxide film made up of said third gate oxide film and said second gate oxide film in said first region and said second region on said semiconductor substrate.

4. The semiconductor device manufacturing method according to claim 3, wherein in said fluorine ion implanting step, fluorine ions are implanted such that a range of said fluorine may measure 15 to 150 nanometers in said semiconductor substrate in a direction approximately perpendicular to the substrate surface.

5. The semiconductor device manufacturing method according to claim 3, wherein said fluorine ion implanting step is replaced by an alternative fluorine ion implanting step for removing said chemical oxide film prior to implanting a fluorine ion directly into said semiconductor substrate.

6. A semiconductor device manufacturing method for forming three kinds of metal oxide semiconductor transistors having a first gate oxide film with a small film thickness, a second gate oxide film with a medium film thickness, and a third gate oxide film with a large film thickness respectively on a semiconductor substrate, said method comprising:

a first gate oxide film forming step for forming a third gate oxide film having said large film thickness on said semiconductor substrate;

a first gate oxide film removing step for selectively removing said third gate oxide film in a first region wherein said first gate oxide film is to be formed on said semiconductor substrate and in a second region wherein said second gate oxide film is to be formed on said semiconductor substrate;

a chemical oxide film forming step for forming a chemical oxide film in said first region and said second region on said semiconductor substrate;

a fluorine ion implanting step for selectively implanting ions of fluorine through said chemical oxide film in said second region on said semiconductor substrate;

washing said semiconductor substrate causing formation of another chemical oxide film in said first and second regions; and an oxidation processing step for, with said other chemical oxide film formed by said washing left unremoved, forming a second gate oxide film made up of said first gate oxide film and said second gate oxide film, which are both smaller than a film thickness of said third gate oxide film, in said first region and said second region on said semiconductor substrate.

7. The semiconductor device manufacturing method according to claim 5, wherein in said fluorine ion implanting step, fluorine ions are implanted such that a range of said fluorine may measure about 20 nanometers in said semiconductor substrate in a direction approximately perpendicular to the substrate surface.

8. The semiconductor device manufacturing method according to claim 6, wherein said fluorine ion implanting step is replaced by an alternative fluorine ion implanting step for removing said chemical oxide film prior to implanting a fluorine ion directly into said semiconductor substrate.

9. The semiconductor device manufacturing method of claim 6, wherein in said fluorine ion implanting step, fluorine ions are implanted such that a range of said fluorine measures about 20 nanometers in said semiconductor substrate.

10. The semiconductor device manufacturing method of claim 9, wherein said fluorine ion implanting steps is replaced with an alternative fluorine ion implanting step for removing said chemical oxide film prior to implanting a fluorine ion directly into said semiconductor substrate.

11. The semiconductor device manufacturing method of claim 10, further comprising:

forming, prior to said fluorine implanting, a photoresist film patterned to expose only said second region, wherein said fluorine implanting is performed in accordance with said photoresist film; and removing, prior to said washing, said photoresist in two steps of a plasma removal step and an acid removal step, said acid removal step causing formation of a chemical oxide film.

12. The semiconductor device manufacturing method of claim 11, wherein said washing uses a mixed solution of sulfuric acid and hydrogen peroxide.

* * * * *